United States Patent [19]
Onishi et al.

[11] Patent Number: 6,092,463
[45] Date of Patent: Jul. 25, 2000

[54] PRINTING METHOD AND PRINTING DEVICE

[75] Inventors: Hiroaki Onishi, Higashiosaka; Shoji Sato, Neyagawa; Ken Takahashi; Takao Naito, both of Yamanashi-ken, all of Japan

[73] Assignee: Matsushita Electric Industrial Co., Ltd., Japan

[21] Appl. No.: 08/919,278

[22] Filed: Aug. 28, 1997

[30] Foreign Application Priority Data

Sep. 6, 1996 [JP] Japan .................................. 8-235685

[51] Int. Cl.[7] ...................................................... B41M 1/12
[52] U.S. Cl. ............................................ 101/129; 101/123
[58] Field of Search ..................................... 101/123, 124, 101/114, 129

[56] References Cited

U.S. PATENT DOCUMENTS

| | | | |
|---|---|---|---|
| 3,943,849 | 3/1976 | Vasilantone | 101/123 |
| 4,937,097 | 6/1990 | Ichinose et al. | 101/123 |
| 4,949,636 | 8/1990 | Techibana | 101/123 |
| 5,440,980 | 8/1995 | Murakami et al. | 101/114 |
| 5,479,854 | 1/1996 | Chikahisa et al. | 101/123 |

*Primary Examiner*—Ren Yan
*Attorney, Agent, or Firm*—Parkhurst & Wendel

[57] ABSTRACT

A printing method and a printing device are provided, whereby a uniform amount of solder can be coated, printing quality can be improved, variations in adjustment between operators are eliminated, adjustment time is shortened, and productivity can be improved. By keeping the amount of deformation of the end sections of a squeegee constant by maintaining a uniform state of contact between the squeegee and a stencil, there is no occurrence of such problems as unsatisfactory wiping away of a solder paste, which causes the solder paste to be left on the stencil, incomplete filling of the solder paste into the pattern opening, or an increase in the deformation of the end sections of the squeegee, causing solder paste filled into the pattern opening to be scraped away.

5 Claims, 8 Drawing Sheets

FIG. 6A
PRIOR ART
FIG. 6B
PRIOR ART
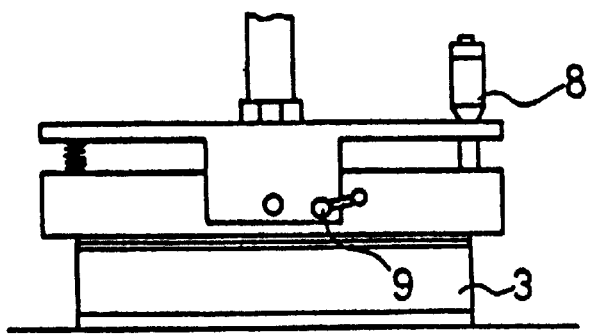
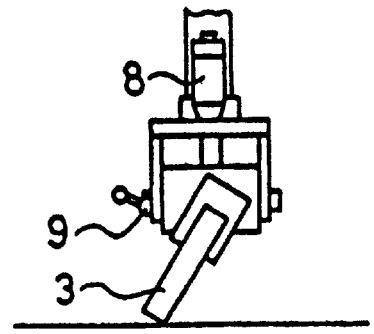

FIG. 8A
PRIOR ART
FIG. 8B
PRIOR ART
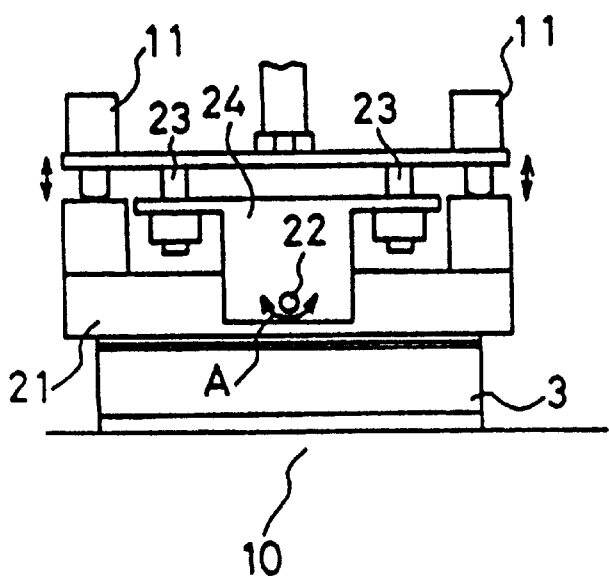
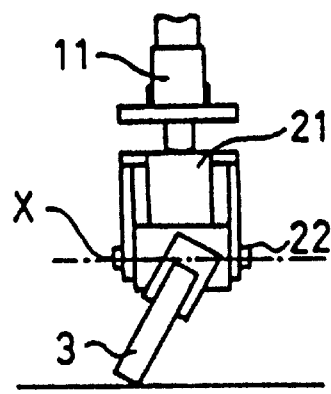

6,092,463

PRINTING METHOD AND PRINTING DEVICE

TECHNICAL FIELD

The present invention relates to a printing method and a printing device whereby a printing material such as solder paste, conductive paste, insulating paste, or the like, is coated by printing onto a surface to be printed.

BACKGROUND ART

Conventionally, in the manufacture of an electronic circuit board, for example, solder paste is generally used for soldering electronic components such as chip components, or the like, onto a printed circuit board, and a solder paste printing device is used in order to apply this solder paste by printing in a desired pattern.

solder paste printing by means of a solder paste printing device of this kind is now described on the basis of FIG. 4 and FIG. 5.

FIG. 4 is an approximate view of solder paste printing, and FIG. 5 is an expanded view thereof. In the drawings, 1 is a metal stencil wherein a desired pattern opening 2 is formed, and 3 is a printing squeegee which moves linearly in the direction of printing, 4 is a printed circuit board, 5 is a solder resist and 6 is a land whereon solder paste 7 is printed.

In the aforementioned composition, solder paste printing involves positioning a stencil 1 over the printed circuit board 4 and superimposing it thereupon, moving the squeegee 3 linearly along the direction of printing in a state whereby it is caused to contact the stencil 1 under a suitable pressure, filling solder paste 7 into the pattern opening 2 on the stencil, and then separating the printed circuit board 4 from the stencil 1, whereby solder paste 7 is applied by printing onto the land 6 of the printed circuit board 4 via the stencil 1.

Usually, the squeegee 3 is held by a squeegee head, and the composition of a squeegee head mounted in a conventional solder paste printing device is shown in FIGS. 6A and 6B, in which 8 is a micrometer for adjusting parallelism and 9 is a fixing bolt.

When conducting solder paste printing, firstly, the parallelism between the surface to be printed and the squeegee 3 is adjusted. After the squeegee has been adjusted so that it is parallel with the surface to be printed using the micrometer 8 for adjusting parallelism, it is fixed in this state using the fixing bolt 9. In this way, conventional solder paste printing is conducted by moving the squeegee 3 in its fixed state over the stencil 1.

The printed circuit board 4 forming the surface to be printed is usually not completely flat, but rather contains warping or undulation. Furthermore, in the case of double-sided component mounting, or the like, where electronic components are soldered to both the front and rear sides of the printed circuit board 4, there is a tendency for warping or undulation to be increased by heating during application of solder to the surface of the printed circuit board.

A case where solder paste is printed onto a surface to be printed containing warping or undulation in this way by means of a printing device of the aforementioned conventional composition is now described on the basis of FIG. 7. (FIG. 7 is an approximate diagram showing the state of a squeegee 3 on a surface 10 to be printed containing warping and undulation, and the stencil 1 is omitted from the drawing.)

In FIG. 7, since the squeegee 3 moves over the surface 10 to be printed in a fixed state, at recess sections 10a in the surface 10 to be printed the end section of the squeegee 3 is in a floating state, and conversely, at projecting section 10b, the deformation of the squeegee 3 increases and it presses more strongly than usual against the surface 10 to be printed. In fact, at the recess sections, the squeegee 3 does not wipe the solder paste 7 away satisfactorily, solder paste 7 remains on the stencil 1 and it is not filled completely into the pattern opening 2, whereas at the projecting sections, solder paste 7 filled into the pattern opening 2 is scraped away due to the increase in the deformation of the end sections of the squeegee 3, and hence there is a disparity in the amount of solder printed onto the surface 10 to be printed, and it is difficult to print a uniform amount of solder across the whole surface 10 to be printed.

Furthermore, since the adjustment of the parallelism of the squeegee prior to printing is a sensitive operation, individual differences between operators readily occur, leading to large variations in this adjustment, and the adjustment operation also takes time and causes productivity to fall.

Various means have been investigated with the object of resolving the aforementioned problems, for example, in a squeegee head of the composition shown in FIGS. 8A and 8B, the squeegee 3 is devised such that it is able to follow warping and undulation in the surface 10 to be printed, and in order to dispense with the need for adjustment of the parallelism of the squeegee, a lower squeegee holding member 21 for holding the squeegee 3 is coupled by means of a shaft 22 at a central position on the squeegee holding member 21 to a middle squeegee holding member or vertically moving member 24 which can move vertically along guides 23, as shown in FIGS. 8A and 8B, and pressure is applied to both end sections of the squeegee holding member 21 by air cylinders 11. Since the squeegee holding member 21 is rotatable in direction A as shown in FIG. 8A using the shaft 22 as an axis, rather than being fixed as in the prior art, the squeegee 3 can be rotated and moved vertically by applying pressure by means of air cylinders 11 provided at the end sections of the squeegee 3 centerd about a rotating axis X in line with the direction of travel of the squeegee.

According to this composition, as shown in FIGS. 9 and 10, by applying pressure to the squeegee 3 by means of the air cylinders 11 such that an appropriate printing pressure is achieved, the squeegee 3 rotates and moves vertically in response to recesses 10a and projections 10b in the surface 10 to be printed, in other words, the stroke of the air cylinders 11 varies, thereby enabling the squeegee 3 to follow the surface 10 to be printed at a constant printing pressure.

However, as shown in FIGS. 9 and 10, whilst the aforementioned composition is effective when the warping and undulation (recesses 10a and projections 10b) in the surface 10 to be printed are parallel to the longitudinal direction of the squeegee 3, in reality, the warping and undulation on a printed circuit board is complex and in general, little of it is parallel to the squeegee 3. Therefore, as shown in FIGS. 11 and 12, if it is not parallel, then similarly to a squeegee head of the aforementioned prior art composition, the squeegee 3 will assume a floating state above the surface 10 to be printed, there will be a disparity in the amount of solder printed onto the surface 10 to be printed, and it will be difficult to print a uniform amount of solder.

DISCLOSURE OF THE INVENTION

The present invention resolves the aforementioned problems of the prior art, and it provides a printing method and a printing device whereby variations in printing can be prevented, a uniform amount of printing material (for example, solder,) can be coated by printing onto a surface to be printed, and printing quality can be improved, whilst variations in adjustment between different operators can be prevented, the adjustment time can also be reduced, and productivity can be raised.

In order to resolve the aforementioned problems, the printing method and printing device according to the present invention are characterized in that the printing pressure and the amount of deformation of the end sections of the squeegee are kept constant by maintaining a uniform state of contact between the squeegee and the stencil, and moreover, adjustment of the parallelism of the squeegee, which used to be carried out before printing, is conducted automatically.

The printing method according to the present invention is applied to cases where, in order to coat a printing material onto a surface to be printed, a squeegee is moved over a printing stencil having a desired pattern opening formed therein, so as to print said printing material onto the surface to be printed via the stencil. This printing method is characterized in that the squeegee is caused to rotate about an axis in line with the direction of its travel and also about an axis perpendicular to the surface to be printed, so that, when moving over the stencil, the squeegee can follow warping and undulation in any direction on the surface to be printed.

In a printing device wherein, in order to coat a printing material onto a surface to be printed, a squeegee is moved over a printing stencil having a desired pattern opening formed therein, so as to print the printing material onto the surface to be printed via the stencil, the printing device according to the present invention comprises a squeegee head which is adapted to cause the squeegee, when moving over the stencil, to rotate about an axis in line with the direction of its travel and also about an axis perpendicular to the surface to be printed, and preferably, the squeegee also moves in a vertical direction perpendicular to the surface to be printed. The printing device according to the present invention further comprises slidable pressing means consisting of an elastic material or the like which are provided at both end sections of the squeegee centerd about the rotating axis in line with the direction of travel of the squeegee and the rotating axis perpendicular to the surface to be printed, respectively, such that the squeegee rotates about these rotating axes and moves in a vertical direction perpendicular to the surface to be printed.

By means of the foregoing method and composition, the printing pressure and the amount of deformation of the squeegee end sections etc. are kept constant by maintaining a uniform state of contact between the squeegee and the stencil, and moreover, adjustment of the parallelism of the squeegee, which used to be carried out before printing, is conducted automatically.

In this way, according to the present invention, the printing pressure and the amount of deformation of the squeegee end sections etc. are kept constant by maintaining a uniform state of contact between the squeegee and the stencil.

Therefore, variations in printing can be prevented, a uniform amount of printing material can be coated by printing onto a surface to be printed, and printing quality can be improved.

Furthermore, adjustment of the parallelism of the squeegee, which used to be carried out before printing, can be conducted automatically.

Therefore, variations in adjustment between different operators can be prevented, the adjustment time can also be reduced, and productivity can be raised.

BRIEF DESCRIPTION OF THE DRAWINGS

FIGS. 6A and 6B are compositional diagrams of a squeegee head in a prior art printing device;

FIGS. 8A and 8B are compositional diagrams of a squeegee head in a printing device according to a further prior art example;

EMBODIMENTS

Below, a printing method and a printing device of an embodiment of the present invention are described in specific terms with reference to the drawings. Here, the printing method is described using an example where solder paste is employed as the printing material.

Figure 1A:
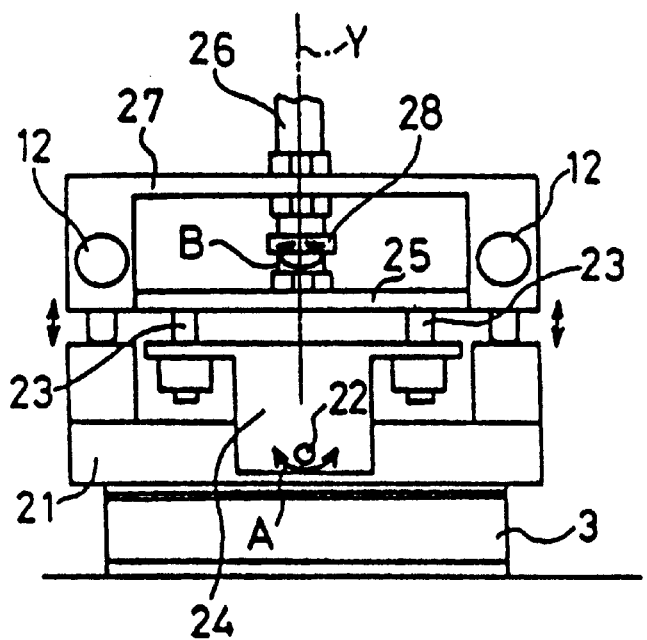
FIGS. 1A and 1B are compositional diagrams of a squeegee head in a printing device according to an embodiment of the present invention.
Figure 1B:
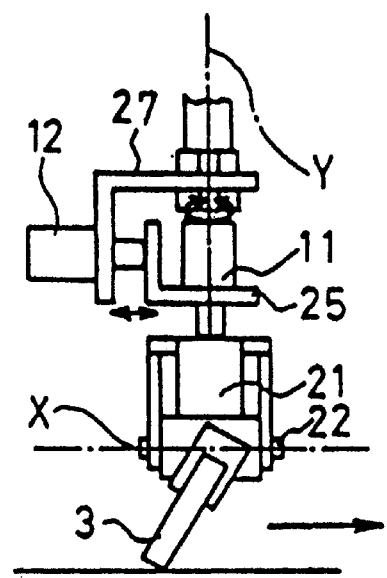

FIGS. 1A and 1B are approximate diagrams of a printing device (solder paste printing device) in this embodiment, and they show the region of the squeegee head thereof. Elements having the same action as in the prior art example are given the same label and descriptions thereof are omitted here.

In this solder paste printing device, as shown in FIGS. 1A and 1B, in addition to the aforementioned composition, an upper squeegee holding member of a guide holding member 25 for holding guides 23 and a fixing member 27 fixed to a shaft 26 are coupled by means of a rotating member 28 at a central position on the guide holding member 25, pressure is applied to the end sections of the guide holding member 25 by means of air cylinders 12, and the guide holding member 25 is rotatable in direction B shown in FIG. 1A about the rotating member 28 which acts as an axis. A rotating axis X in the direction of travel of the squeegee 3 and a rotating axis Y in a perpendicular direction to the surface to be printed are provided, and air cylinders 11, 12 are provided at the end sections centered about these respective rotating axes X, Y.

Figure 4:
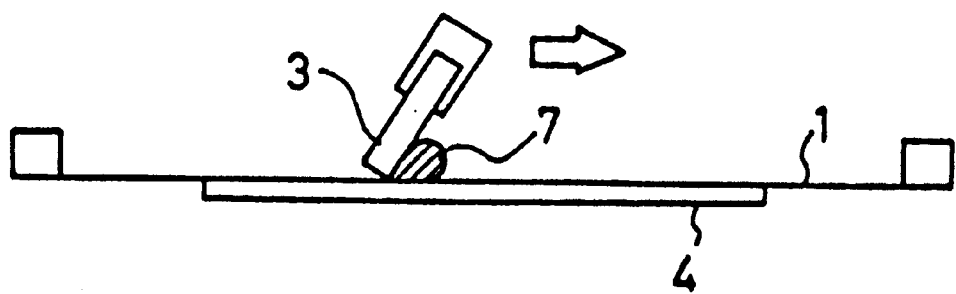
FIG. 4 is a conceptual illustrative diagram of solder paste printing in a solder paste printing device.
Figure 5:
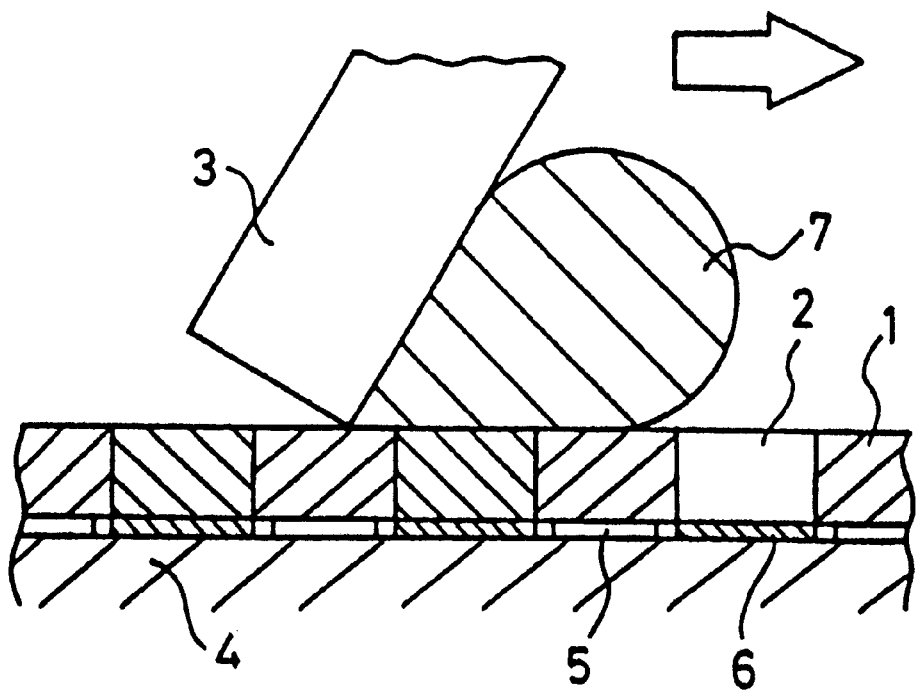
FIG. 5 is an expanded diagram of FIG. 3.
Figure 7:
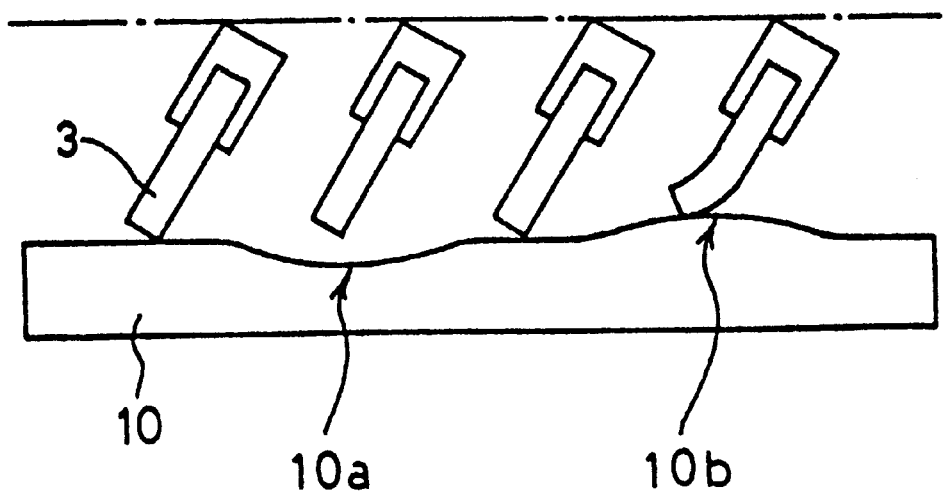
FIG. 7 is an illustrative diagram of the operational state of a squeegee in the same prior art example.
Figure 9:
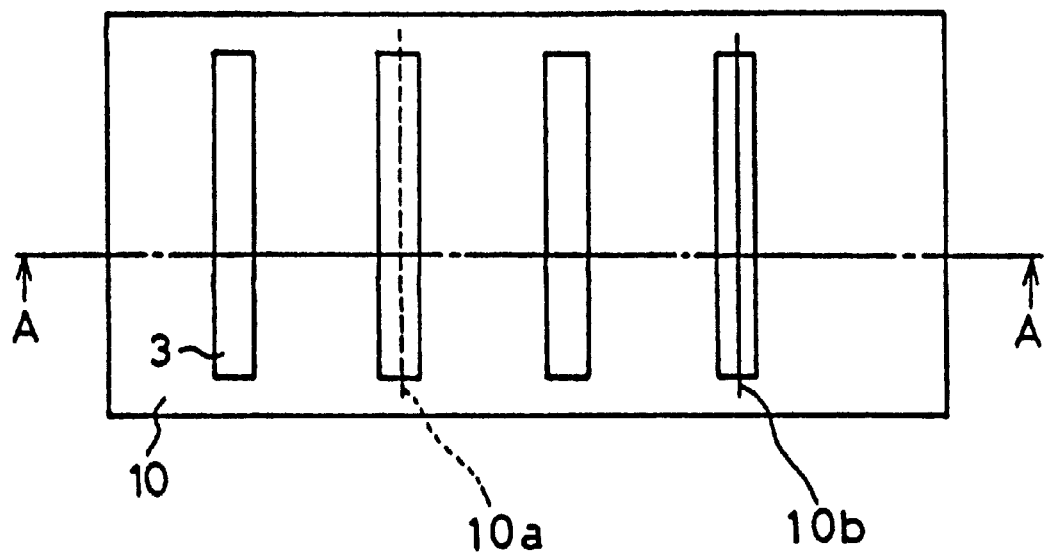
FIG. 9 is a plan diagram of the operational state of a squeegee in the same prior art example.
Figure 10:
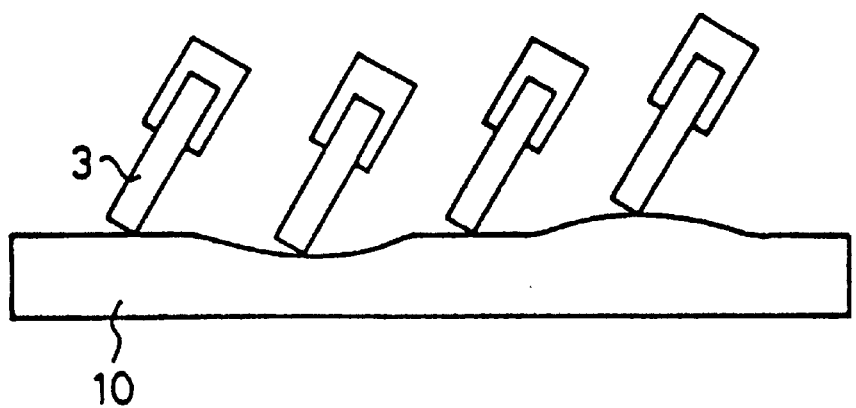
FIG. 10 shows the squeegee of FIG. 9 rotated along the X—X line.
Figure 11:
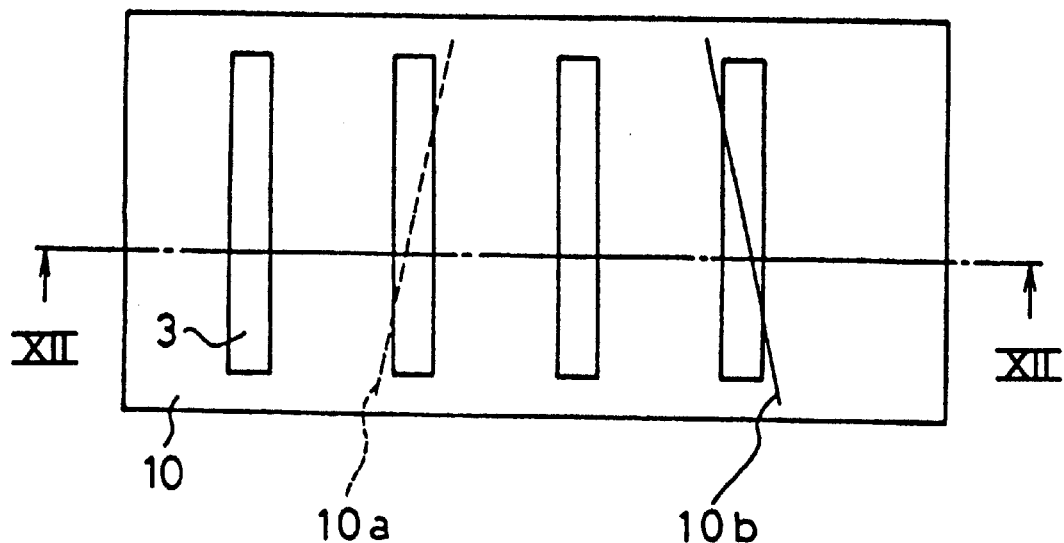
FIGS. 11 and 12 are illustrative diagrams of the operational state of a squeegee in a printing device according to yet a further prior art example.
Figure 12:
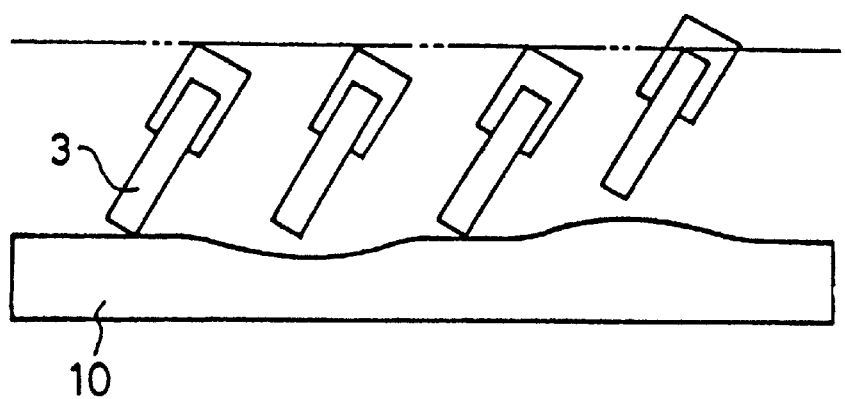

In a solder paste printing device wherein the region of the squeegee head is composed as described above, similarly to a conventional method as illustrated in FIG. 4 and FIG. 5, a stencil 1 is positioned over a printed circuit board 4 and superimposed thereupon, and a squeegee 3 is caused to contact the stencil 1 at a suitable printing pressure by means of air cylinders 11. In this case, a suitable pressure is also applied by means of air cylinders 12.

The squeegee 3 is moved in this state, and since pressure is applied to the end sections thereof centered about the rotating axis X by means of the air cylinders 11, the squeegee 3 can rotate about an axis in line with its direction of travel, and it can move vertically in a direction perpendicular to its direction of travel. Whereby, the stroke of the air cylinders 11 can be varied in accordance with the inclination of the printed circuit board 4, and the squeegee 3 can be made to contact the stencil 1 in a state of similar inclination.

In other words, the parallelism of the squeegee 3 is adjusted automatically by applying pressure to the squeegee 3 by means of the air cylinders 11 such that a suitable printing pressure is obtained. By way of maintaining the squeegee head in this state whilst moving it linearly in the printing direction, filling solder paste 7 into the pattern opening 2 in the stencil 1 by means of the squeegee 3, and then separating the printed circuit board 4 from the stencil 1, the solder paste 7 is printed onto a land 6 on the printed circuit board 4 via the stencil 1.

Figure 2:
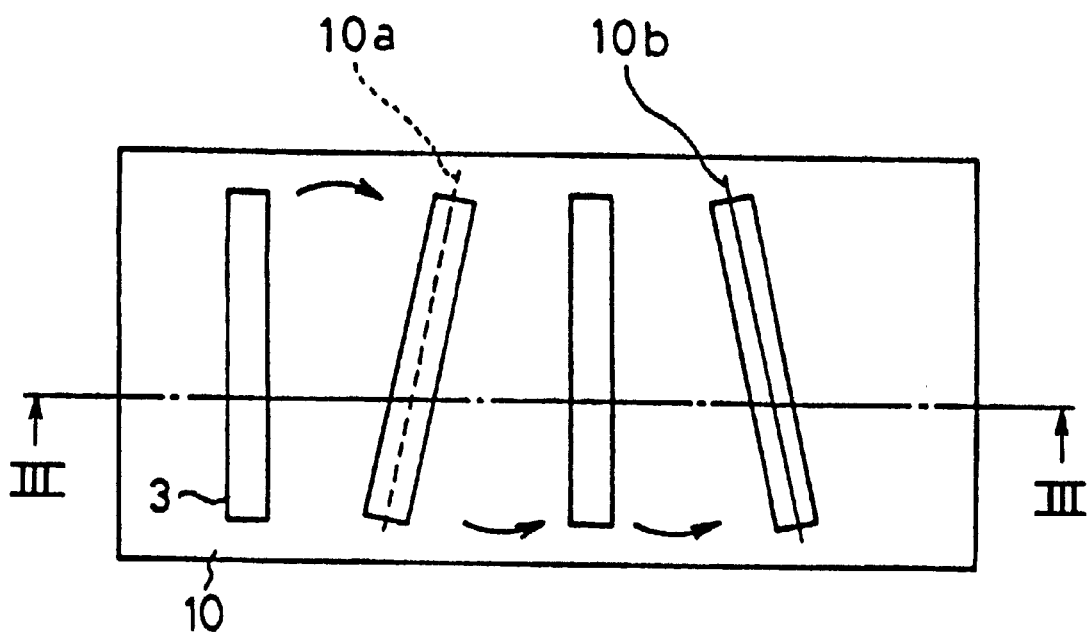
FIG. 2 is a plan diagram of the operational state of a squeegee in the same embodiment.
Figure 3:
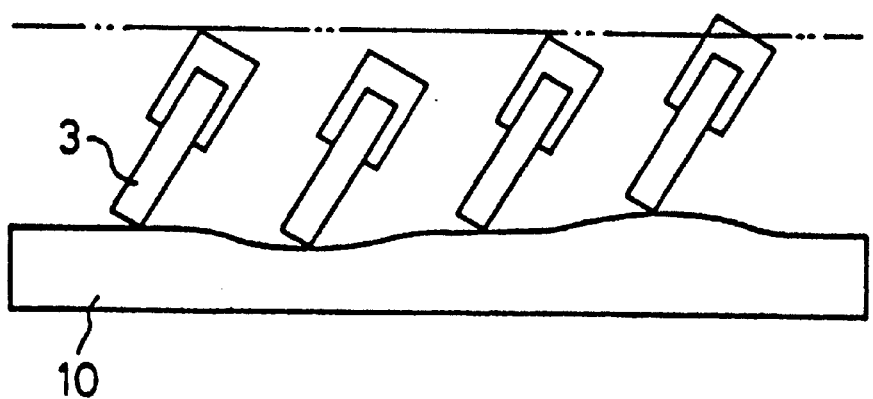
FIG. 3 shows the squeegee of FIG. 2 rotated along the III—III line.

If printing is carried out as described above, as shown in FIGS. 2 and 3, since pressure is applied in advance to the end sections centerd about the rotating axis Y by means of the air cylinders 12 in response to warping or undulation in the surface 10 to be printed which is not parallel to the longitudinal direction of the squeegee 3, the stroke of the air cylinder 12 changes and the squeegee 3 rotates such that it is parallel to the recess 10a or projection 10b, and therefore, the squeegee can be moved in response to complex warping or undulation (recess or projection) in the printed circuit board 4 (surface 10 to be printed), whilst maintaining a constant printing pressure (pressing force).

Consequently, even in the case of a printed circuit board 4 containing complex warping and undulation, since the state of contact between the squeegee 3 and the stencil 1 is uniform during the travel of the squeegee 3, there is no occurrence of problems such as unsatisfactory wiping away of the solder paste 7, which causes solder paste 7 to be left on the stencil 1, incomplete filling of the solder paste 7 into the pattern opening 2, or an increase in the deformation of the end sections of the squeegee 3, causing the solder paste 7 filled into the pattern opening 2 to be scraped away, so that a uniform amount of the solder paste 7 can be printed onto the printed circuit board 4 without occurrence of printing variations, or the like. Furthermore, since the parallelism of the squeegee is adjusted automatically, the adjustment time can be shortened.

In the present embodiment, air cylinders are used as pressing means, but it is also possible to use an elastic body or the like, such as a spring or rubber, and the invention is not limited to this, provided that the pressing means is slidable.

We claim:

1. A method for printing a coating material onto a surface to be printed by moving a squeegee over a stencil having a pattern of openings formed therein to permit said coating material to be printed onto said surface, wherein a squeegee head having both (1) a squeegee holding member to hold the squeegee that is rotatable about an axis in-line with a travel direction in which said squeegee is moved, and (2) an upper guide holding member that is rotatable about an axis perpendicular to the surface to be printed for supporting said squeegee holding member, said method comprising the steps of:

setting at a predetermined value each downward pressure to be applied to said squeegee holding member by a pair of vertical pressing means mounted to said upper guide holding member;

setting at a predetermined value each horizontal pressure to be applied to said upper guide holding member so as to rotate said upper guide holding member about said axis perpendicular to the surface to be printed, by a pair of horizontal pressing means mounted on a fixed member that is fixed to a squeegee moving means; and moving the squeegee under the above conditions by activating the squeegee moving means.

2. A squeegee printing device for applying via a stencil a printing material onto a surface to be printed comprising:

a squeegee head comprising an upper squeegee holding member and a lower squeegee holding member;

said lower squeegee holding member directly holding a squeegee and said upper squeegee holding member supporting said lower squeegee holding member;

a fixed member affixed to a squeegee moving means;

a pair of horizontally slidable pressing means provided to said fixed member;

said upper squeegee holding member being rotatably provided about a vertical axis to said fixed member so that said pair of horizontally slidable pressing means presses each end of said upper squeegee holding member with respect to said vertical axis;

said lower squeegee holding member being rotatably provided to said upper squeegee holding member about a horizontal axis in-line with a direction in which said squeegee travels; and a pair of vertically slidable pressing means provided to said upper squeegee holding member.

3. The squeegee printing device according to claim 2 wherein said squeegee head further comprises a middle squeegee holding member slidably attached to a guide between said upper squeegee holding member and said lower squeegee holding member to permit vertical adjustment of space between said upper and lower squeegee holding members by sliding said middle squeegee holding member vertically.

4. The squeegee printing device according to claim 2, wherein said horizontally slidable pressing means and said vertically slidable pressing means are constructed of an elastic material.

5. A squeegee printing device for applying via a stencil a printing material onto a surface to be printed, comprising:

a squeegee holding member for holding a squeegee, said holding member being coupled to a first shaft, said first shaft being attached to a vertically moving member guided by guide means;

first pressure application means for dynamically applying downward pressure to end portions of said squeegee holding member about an axis in-line with a squeegee travel direction;

a guide holding member for holding the guide means, said guide holding member being coupled to a rotating member at an end of a second shaft extending in a vertical direction perpendicular to the axis in-line with the squeegee travel direction;

a fixing member fixed to said second shaft; and second pressure application means mounted on said fixing member for dynamically applying lateral pressure to end portions of the guide holding means and for dynamically stabilizing said squeegee holding member about a vertical axis perpendicular to the axis in-line with a squeegee travel direction.

* * * * *